(12) United States Patent
Anderson et al.

(10) Patent No.: US 8,963,239 B2
(45) Date of Patent: Feb. 24, 2015

(54) 800 V SUPERJUNCTION DEVICE

(71) Applicant: Icemos Technology Ltd., Belfast (GB)

(72) Inventors: Samuel Anderson, Tempe, AZ (US); Takeshi Ishiguro, Fukushima-ken (JP); Kenji Sugiura, Kanagawa-ken (JP)

(73) Assignee: Icemos Technology, Ltd., Belfast (GB)

( * ) Notice: Subject to any disclaimer, the term of this patent is extended or adjusted under 35 U.S.C. 154(b) by 0 days.

(21) Appl. No.: 14/205,734

(22) Filed: Mar. 12, 2014

(65) Prior Publication Data

US 2014/0264582 A1 Sep. 18, 2014

Related U.S. Application Data

(60) Provisional application No. 61/778,906, filed on Mar. 13, 2013.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 21/336* | (2006.01) |
| *H01L 29/78* | (2006.01) |
| *H01L 29/66* | (2006.01) |

(52) U.S. Cl.
CPC ...... *H01L 29/7823* (2013.01); *H01L 29/66704* (2013.01)

USPC .......................... 257/339; 438/286; 438/291

(58) Field of Classification Search
CPC ..................... H01L 29/66704; H01L 29/7823
USPC .................................... 257/339; 438/286, 291
See application file for complete search history.

(56) References Cited

U.S. PATENT DOCUMENTS

| | | | |
|---|---|---|---|
| 7,723,172 B2 * | 5/2010 | Ishiguro | 438/207 |
| 2013/0320512 A1 * | 12/2013 | Irsigler et al. | 257/655 |
| 2014/0124855 A1 * | 5/2014 | Hebert | 257/334 |
| 2014/0145256 A1 * | 5/2014 | Venkatraman et al. | 257/329 |

* cited by examiner

*Primary Examiner* — David S Blum
(74) *Attorney, Agent, or Firm* — Panitch Schwarze Belisario & Nadel LLP

(57) ABSTRACT

A superjunction device includes a substrate having first and second main surfaces and a first doping concentration of a first dopant. A first semiconductor layer having a second doping concentration of the first dopant is formed on the substrate. A second semiconductor layer is formed on the first layer and has a main surface. At least one trench extends from the main surface at least partially into the first semiconductor layer. A first region having a third doping concentration of the first dopant extends at least partially between the main surface and the first layer. A second region having a fourth doping concentration of a second dopant is disposed between the first region and a trench sidewall and extends at least partially between the main surface and the first layer. A third region having a fifth doping concentration of the first dopant is disposed proximate the main surface.

18 Claims, 8 Drawing Sheets

800 V SUPERJUNCTION DEVICE

CROSS-REFERENCE FOR RELATED APPLICATIONS

This application claims the benefit of U.S. Provisional Patent Application No. 61/778,906, filed on Mar. 13, 2013, entitled "800 Volt Superjunction Device," the entire contents of which are incorporated by reference herein.

BACKGROUND OF THE INVENTION

Embodiments of the present invention relate generally to superjunction devices, and more particularly, to superjunction devices that can support higher blocking voltages while maintaining simplicity of manufacturability.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated herein by reference.

Superjunction devices, including, but not limited to metal-oxide-semiconductor field-effect transistors (MOSFET), diodes, and insulated-gate bipolar transistors (IGBT), have been or will be employed in various applications such as automobile electrical systems, power supplies, and power management applications. For example, superjunction devices may specifically be employed in light emitting diode (LED) televisions, electric or hybrid cars, LED light bulbs, servers, tablets, uninterruptable power supplies (UPS), and the like. Such devices sustain high voltages in the off-state and yield low voltages and high saturation current densities in the on-state.

FIG. 1 is an enlarged partial cross-sectional view of a prior art trench-type superjunction device 110. A semiconductor substrate 112 supports on its first main surface 112a a semiconductor layer 116. A plurality of trenches 118 (two shown) are formed in a main surface 116a of the semiconductor layer 116 and extend into the substrate 112. The trenches 118 are filled with a semi-insulating or insulating material 119, and form in an active region a plurality of mesas, each of which has alternating n and p columns 120, 122. In this type of superjunction device 110, the semiconductor layer 116 has a thickness T of about 45 micrometers (µm), and supports a blocking voltage of up to about 650 Volts (V), and in some cases up to about 700 V. Other prior art structures, including non-trench superjunction devices, which are composed of up to seven epitaxially grown semiconductor layers, achieve similar blocking voltages.

FIG. 2 is an enlarged partial cross-sectional view of an attempt to improve the blocking voltage of a prior art trench-type superjunction device. The device 210 shown in FIG. 2 is similar to the device 110 of FIG. 1, with the exception that the thickness T of the semiconductor layer 216 is about 55 µm or greater. Blocking voltages higher than 700 V can be achieved by device 210, but there are significant drawbacks to this technique. For example, the trenches 218, which are typically formed by deep reactive ion etching (DRIE), are necessarily deeper in order to reach the substrate 212, and therefore require longer etching times, which increases the manufacturing expense. The deeper trenches 218 are also more difficult to refill. There is further a significant increase in the stress placed on the device 210, and the potential for warpage thereof is greatly enhanced.

It is therefore desirable to provide a superjunction device that permits an increase in the blocking voltage, but is easier to manufacture and avoids the drawbacks of the design shown in FIG. 2.

BRIEF SUMMARY OF THE INVENTION

Briefly stated, an embodiment of the present invention comprises a superjunction device including a semiconductor substrate having first and second main surfaces and a first doping concentration of a dopant of a first conductivity type. A first semiconductor layer is formed on the first main surface of the semiconductor substrate and has a second doping concentration of the dopant of the first conductivity type. A second semiconductor layer is formed on the first semiconductor layer and has a main surface opposite to the first semiconductor layer. At least one trench is formed in the second semiconductor layer and extends from the main surface through the second semiconductor layer and at least partially into the first semiconductor layer. A first region having a third doping concentration of the dopant of the first conductivity type extends at least partially between the main surface of the second semiconductor layer and the first semiconductor layer. A second region having a fourth doping concentration of a dopant of a second conductivity type different from the first conductivity type is disposed between the first region and a sidewall of the at least one trench and extends at least partially between the main surface of the second semiconductor layer and the first semiconductor layer. A third region having a fifth doping concentration of the dopant of the first conductivity type is disposed proximate to the main surface of the second semiconductor layer.

Another preferred embodiment comprises a method of forming a superjunction device. The method includes providing a semiconductor substrate having first and second main surfaces and a first doping concentration of a dopant of a first conductivity type and forming a first semiconductor layer on the first main surface of the semiconductor substrate. The first semiconductor layer has a second doping concentration of the dopant of the first conductivity type. A second semiconductor layer is formed on the first semiconductor layer. The second semiconductor layer has a main surface opposite to the first semiconductor layer. At least one trench is formed and extends from the main surface of the second semiconductor layer through the second semiconductor layer and at least partially into the first semiconductor layer. At least a portion of a sidewall of the at least one trench is doped with the dopant of the first conductivity to form a first region extending at least partially between the main surface of the second semiconductor layer and the first semiconductor layer. The first region has a third doping concentration. At least a portion of the sidewall of the at least one trench is doped with a dopant of a second conductivity type different from the first conductivity type to form a second region between the sidewall of the at least one trench and the first region and extending at least partially between the main surface of the second semiconductor layer and the first semiconductor layer. The second region has a fourth doping concentration. At least one of a portion of the sidewall of the at least one trench and the main surface of the second semiconductor layer is doped with the dopant of the first conductivity to form a third region proximate the main surface. The third region has a fifth doping concentration.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

DETAILED DESCRIPTION OF THE INVENTION

Figure 1:
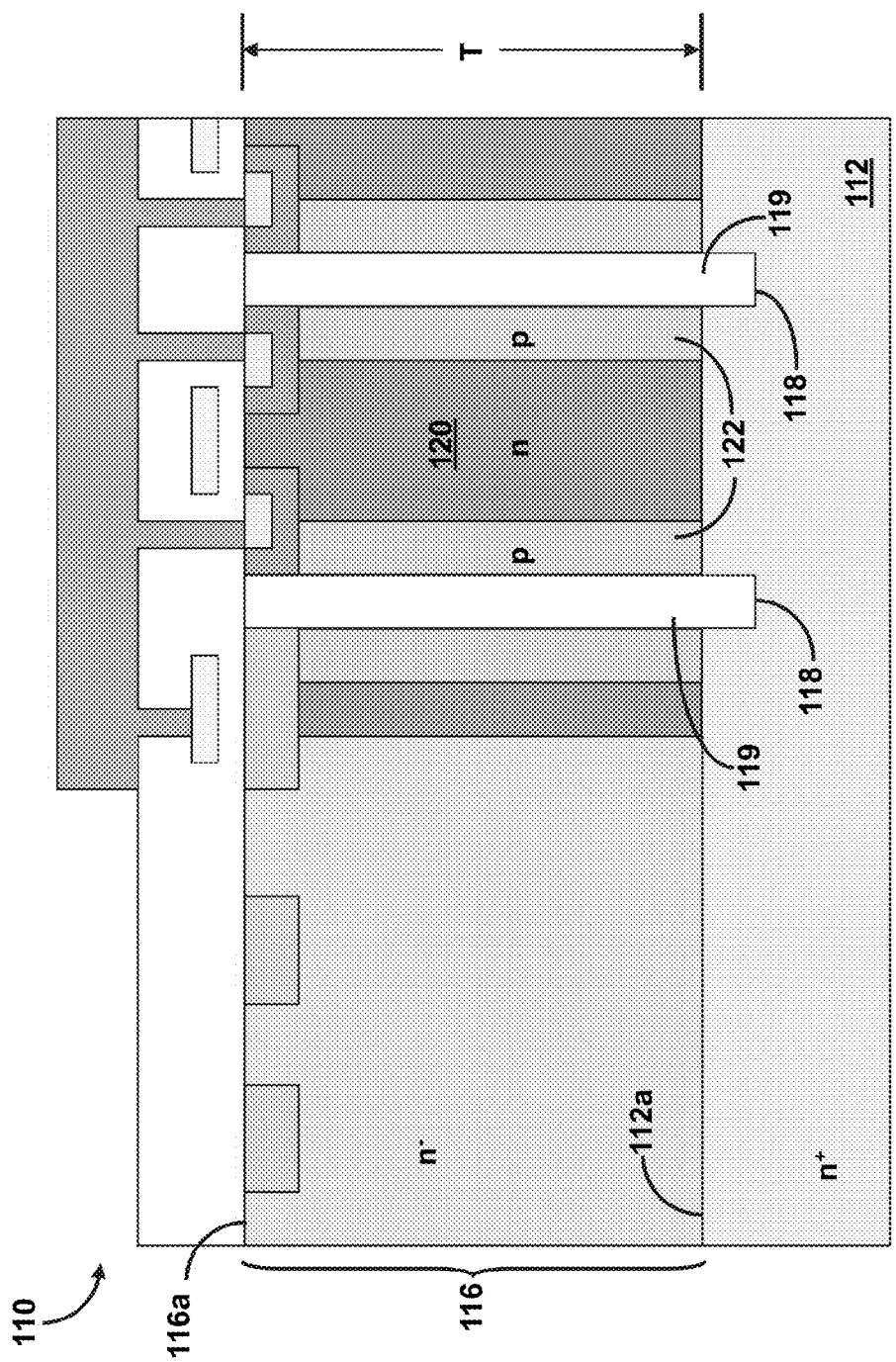
FIG. 1 is a partial sectional elevational view of a first conventional superjunction device.
Figure 2:
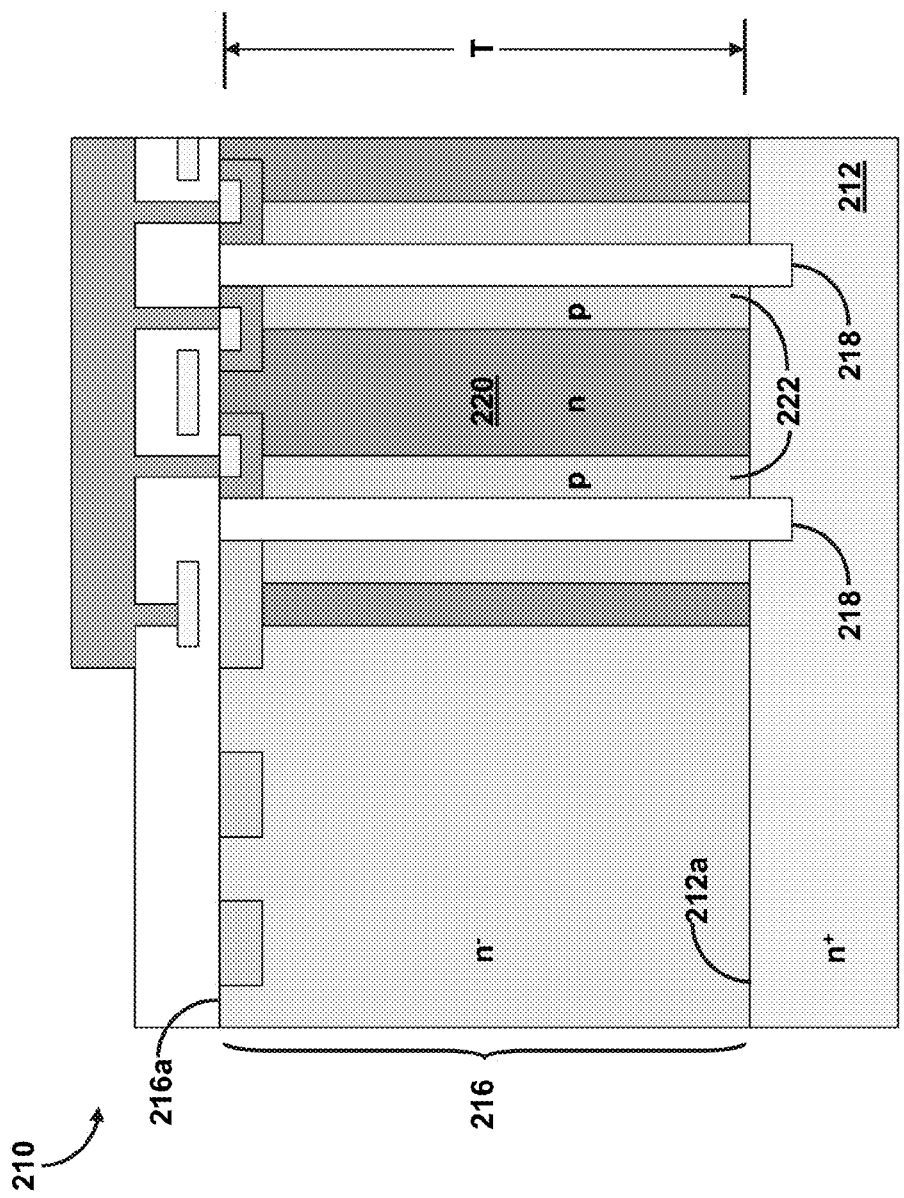
FIG. 2 is a partial sectional elevational view of a second conventional superjunction device.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 3:
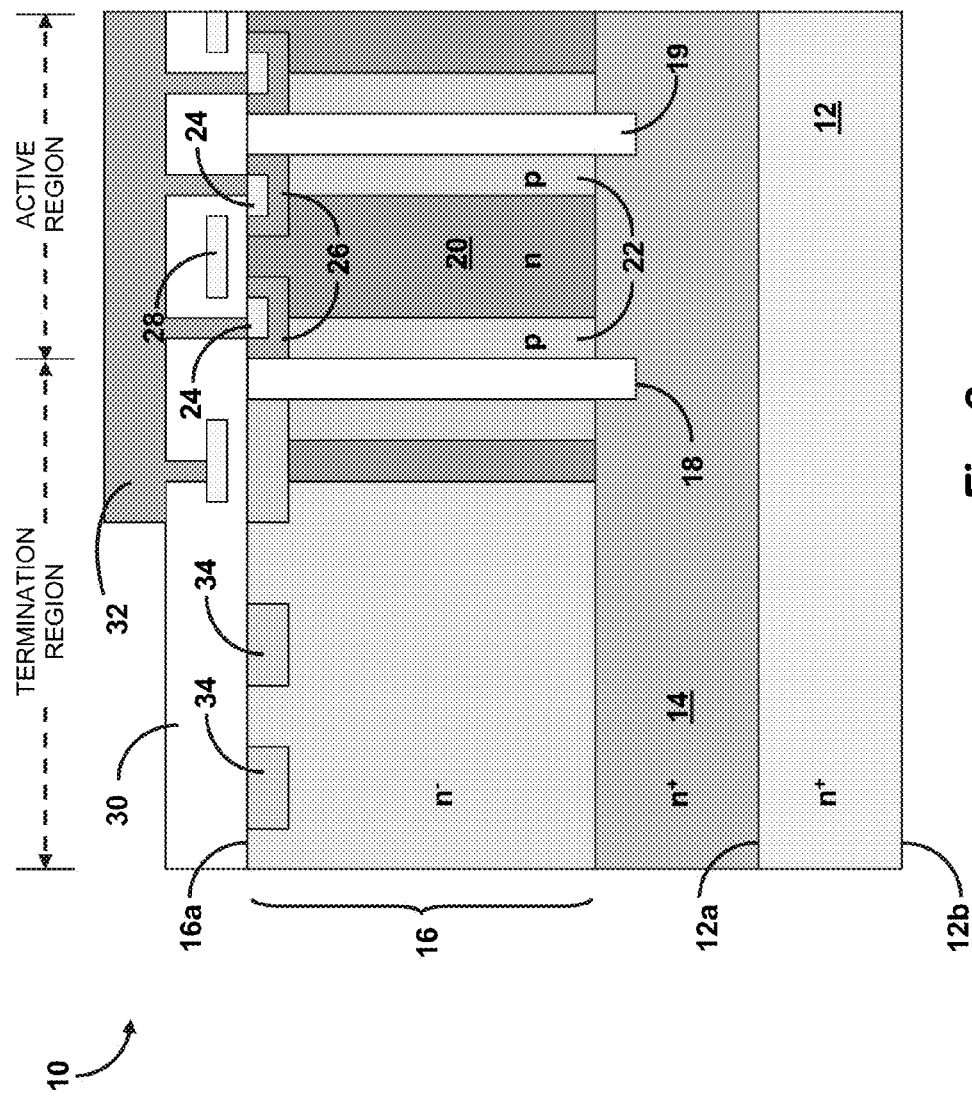
FIG. 3 is a partial sectional elevational view of a superjunction device in accordance with a first embodiment of the present invention.

Referring to the drawings in detail, wherein like reference numerals indicate like elements throughout, there is shown in FIG. 3 an enlarged partial cross-sectional view of a trench-type superjunction device 10 in accordance with certain preferred embodiments of the present invention. The device 10 preferably includes a semiconductor substrate 12 having opposing first and second main surfaces 12a, 12b. A first semiconductor layer 14 is formed on the first main surface 12a of the semiconductor substrate 12. A second semiconductor layer 16 is formed on the first semiconductor layer 14 and has a main surface 16a opposite to the first semiconductor layer 14.

At least one, and preferably more, trenches 18 are formed in the second semiconductor layer 16 and extends from the main surface 16a at least partially into the first semiconductor layer 14. The trenches 18 are mainly formed in an active region of the device 10, although one or more trenches 18 may serve as the boundary with the termination region. The active region is the area in which superjunction devices are constructed. The termination region is the area where no active devices are located, providing isolation between cells of active devices on an overall semiconductor wafer or chip.

The trenches 18 are preferably filled with an insulating or semi-insulating material 19. The trenches 18 also preferably define one or more mesas containing first and second regions in the form of alternating n and p columns 20, 22 that extend at least partially between the main surface 16a of the second semiconductor layer 16 and the first semiconductor layer 14. Highly doped third regions serving as source/drain regions 24 are formed proximate the main surface 16a, and are preferably surrounded by and connected to fourth regions or body regions 26 of an opposite conductivity that are also formed proximate the main surface 16a. A gate 28 may be disposed above the mesa to control adjacent source/drain regions 24. A layer of dielectric material 30 separates the gate 28 from the second semiconductor layer 16. A metal contact 32 connects with the source/drain regions 24. In the termination region, a series of p-rings 34 are formed proximate the main surface 16a.

FIGS. 4-12 generally show a process for manufacturing the superjunction device of FIG. 3 according to one preferred embodiment of the present invention.

Figure 4:
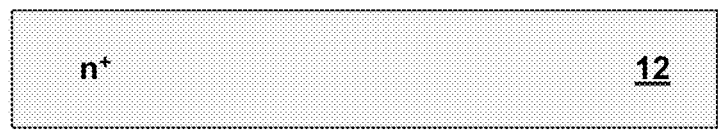
FIG. 4 is a partial sectional elevational view of a semiconductor substrate in accordance with certain preferred embodiments of the present invention.

FIG. 4 shows the semiconductor substrate 12, which is preferably formed of silicon (Si). But, the semiconductor substrate may be formed of other materials such as gallium arsenide (GaAs), germanium (Ge) or the like. The substrate 12 preferably is of the heavily doped $n^+$ type.

Figure 5:
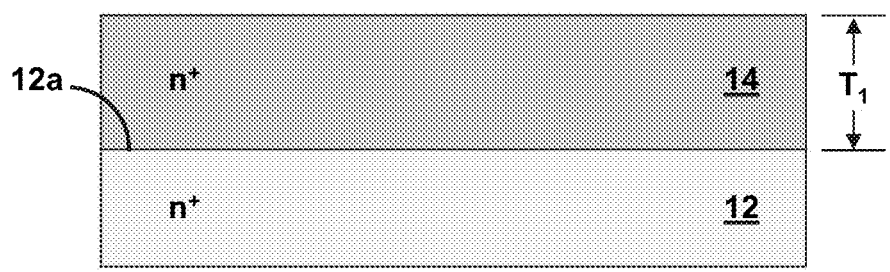
FIG. 5 is a partial sectional elevational view of a first semiconductor layer formed on the substrate of FIG. 4.

In FIG. 5, the first semiconductor layer 14 is formed on the first main surface 12a of the substrate 12. In preferred embodiments, the first semiconductor layer 14 is epitaxially grown on the first main surface 12a, and may be a heavily doped $n^+$ silicon layer. The epitaxial growth or deposition may occur in a suitable reaction chamber at a temperature of up to about 1200° C. Preferably, the first semiconductor layer 14 is epitaxially grown to a thickness $T_1$ of about 150 to about 200 μm. Other methods for forming the first semiconductor layer 14 on the substrate 12, such as by bonding, annealing, and the like, may be used.

Figure 6:
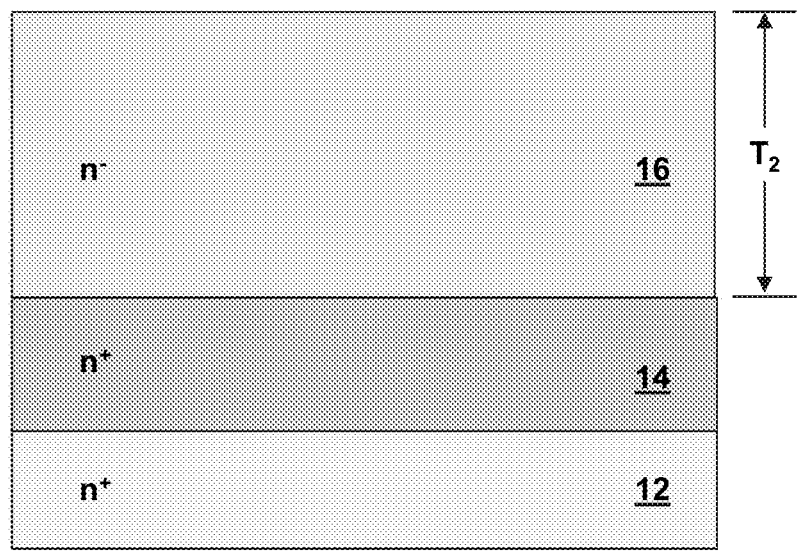
FIG. 6 is a partial sectional elevational view of a second semiconductor layer formed on the structure of FIG. 5.

In FIG. 6, the second semiconductor layer 16 is formed on the first semiconductor layer 14. It is preferred that the second semiconductor layer 16 be epitaxially grown as well, to a conventional thickness $T_2$ of about 45 μm. It should be noted that the drawings herein are not formed to scale. The second semiconductor layer 16 is preferably lightly doped $n^-$ silicon.

Figure 7:
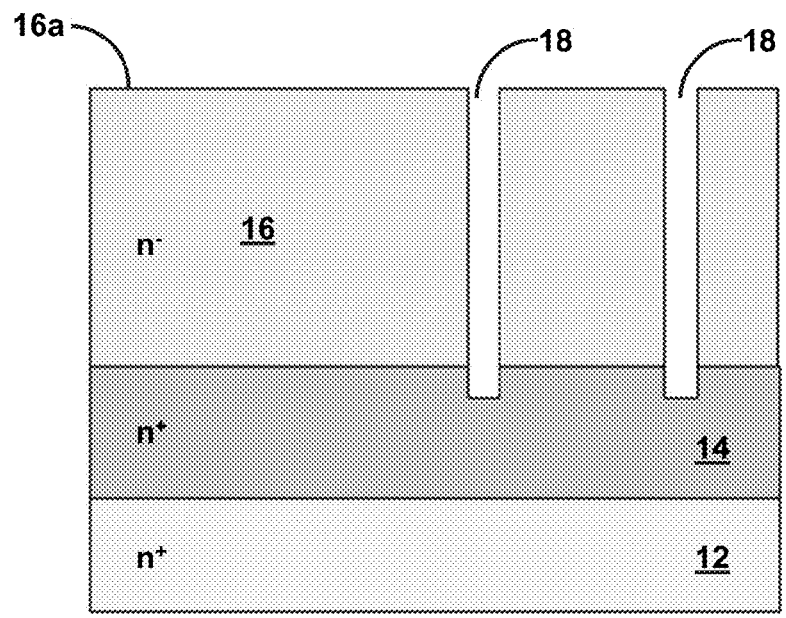
FIG. 7 is a partial sectional elevational view of the structure of FIG. 6 with trenches formed therein.

In FIG. 7, the trenches 18 are formed in the main surface 16a of the second semiconductor layer 16. The trenches 18 are preferably etched using DRIE. DRIE utilizes an ionized gas, or plasma, such as, for example, sulfur hexafluoride ($SF_6$), to remove material from the second semiconductor layer 16. DRIE technology permits deeper trenches 18 with straighter sidewalls. Furthermore, forming deeper trenches 18 that have straighter sidewalls than conventionally etched or formed trenches 18, in addition to other steps in the process, results in a final superjunction device with enhanced avalanche breakdown voltage ($V_b$) characteristics as compared to conventional semiconductor-transistor devices (i.e., the avalanche breakdown voltage ($V_b$) can be increased to about 200 to 1200 Volts or more). Other techniques for forming the trenches 18 can be used, however, such as plasma etching, reactive ion etching (RIE), sputter etching, vapor phase etching, chemical etching, or the like.

A mask (not shown) is selectively applied over the main surface 16a of the second semiconductor layer 16. The mask may be created by deposition of a layer of photoresist or in some other manner well known to those skilled in the art. The developed photoresist is removed and undeveloped photoresist remains in place as is known in the art. For simplification, the mask refers to the material used to prevent certain areas of a semiconductor from being etched, doped, coated or the like. In certain embodiments, a thin layer of oxide or other dielectric material (not shown) may be applied to the main surface 16a prior to formation of the mask. The trenches 18 are formed in the areas not covered by the mask. After the trenching process, the mask is removed using techniques known in the art.

The sidewalls of each trench 18 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of the smoothing techniques can produce smooth trench surfaces with rounded corners while removing residual stress and unwanted contaminates. However, in embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

Figure 8:
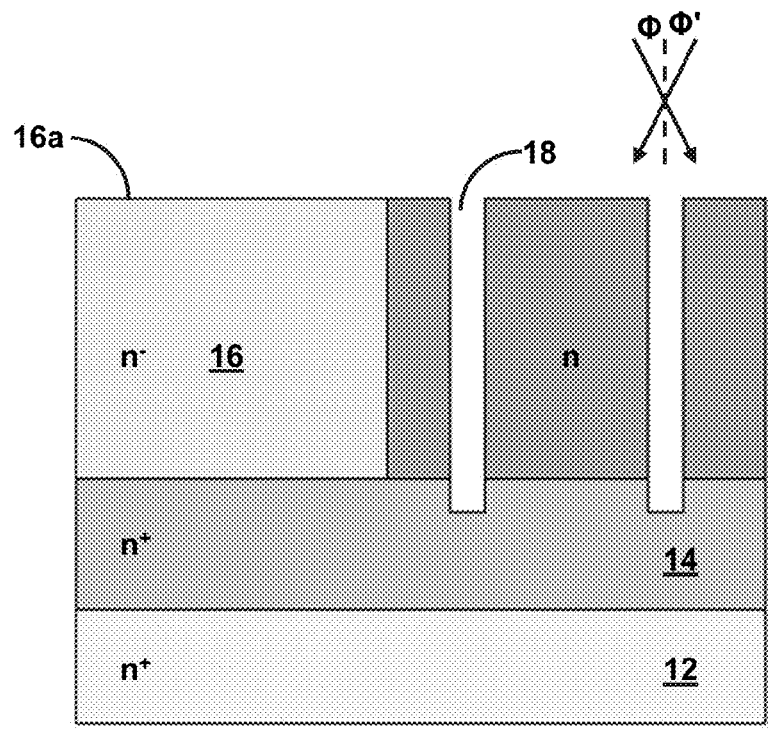
FIG. 8 is a partial sectional elevational view of the structure of FIG. 7 following doping of the trench sidewalls with a first dopant.

In FIG. 8, the sidewalls of the trenches 18 are implanted or doped with an n-type dopant, which may occur at predetermined angles $\Phi$, $\Phi'$. The implantation angles are determined by the width of the trenches 18 and the desired doping depth, and is typically from about 2° to 12° (−2° to −12° from vertical. The implant is done at angles $\Phi$, $\Phi'$ so that the bottom of each trench 18 is not implanted. Preferably, the implantation occurs at least partially, and preferably entirely, between the main surface 16a and the first semiconductor layer 14. The implant is performed at an energy level of about 30-200 kilo-electron-Volts (KeV) with dose ranges from about 1E13 to 1E14 cm$^{-2}$ (i.e., about $1 \times 10^{13}$ to $1 \times 10^{14}$ cm$^{-2}$). Consequently, a dopant of the first conductivity type (e.g., n-type) is implanted into the mesas to form at the sidewall surfaces of the trench 18 doped regions of the first conductivity type having a doping concentration lower than that of the heavily doped first semiconductor layer 14 and substrate 12. The doping preferably occurs with the aid of a mask (not shown) placed over the main surface 16a of the second semiconductor layer 16.

The doping is performed by one of ion implantation, solid diffusion, liquid diffusion, spin-on deposits, plasma doping, vapor phase doping, laser doping, or the like. Doping with boron B results in a more p-type region, doping with phosphorus P results in a more n-type region and doping with arsenic Ar results in a more n-type region. Other dopants may be utilized such as antimony Sb, bismuth Bi, aluminum Al, indium In, gallium Ga or the like depending on the material of the substrate and the desired strength of the doping. Preferably, the doping is performed by ion implantation.

Following implanting, a drive in step at a temperature of up to 1200° Celsius may be performed for up to 12 hours. It should be recognized that the temperature and time are selected to sufficiently drive in the implanted dopant. But, the energy level used to perform ion implantation, as described above, may be high enough to sufficiently drive in the dopants without departing from the present invention.

Figure 9:
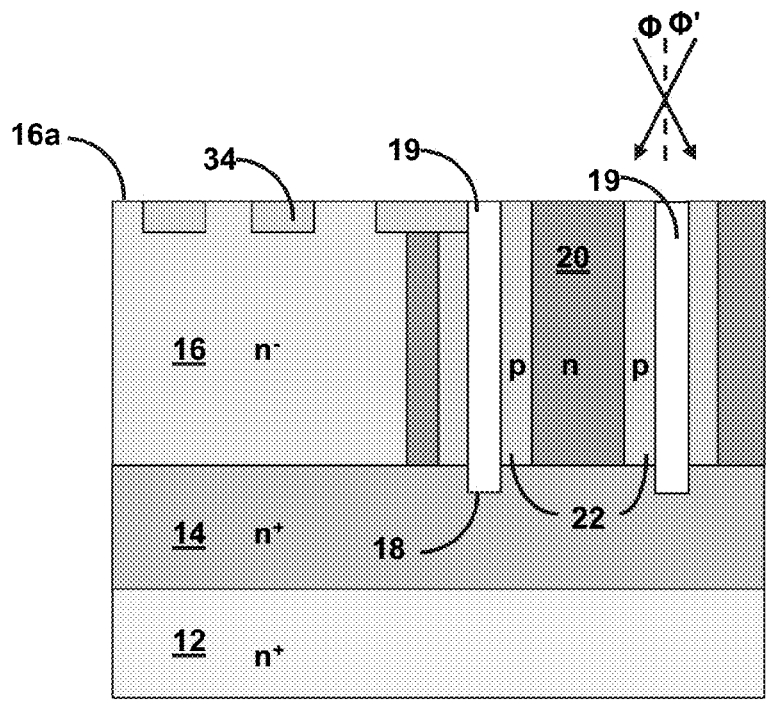
FIG. 9 is a partial sectional elevational view of the structure of FIG. 8 following doping with a second dopant and refilling of the trenches.

In FIG. 9, a similar doping step occurs with respect to the sidewalls of the trenches 18, but with a dopant of the opposite conductivity type (e.g., p-type). Drive-in of the two dopants may occur after each implantation step, or simultaneously. The result is the formation of n and p columns 20, 22 in the active region mesas. P-rings 34 in the termination region of the second semiconductor layer 16 can be implanted simultaneously with the p-type dopant of the sidewalls of the trenches 18, if desired. The p-rings 34 may also be formed earlier or later in the manufacturing process.

Also shown in FIG. 9, after the implantation and drive-in steps to form the n and p columns 20, 22, the trenches 18 are refilled with one of an insulating and semi-insulating material 19. In exemplary embodiments, the material 19 can be a polysilicon, a re-crystallized polysilicon, a single crystal silicon, or a semi-insulating polycrystalline silicon (SIPOS), filled into the trenches 18 using a spun-on-glass (SOG) technique. For example, the trenches 18 can be refilled with SIPOS. The amount of oxygen content in the SIPOS is selectively chosen to be between 2% and 80% to improve the electrical characteristics of the active region. Increasing the amount of oxygen content is desirable for electrical characteristics, but varying the oxygen content also results in altered material properties. Higher oxygen content SIPOS will thermally expand and contract differently than the surrounding silicon which may lead to undesirable fracturing or cracking especially near the interface of differing materials. Accordingly, the oxygen content of the SIPOS is optimally selected to achieve the most desirable electrical characteristics without an undesirable impact on mechanical properties.

The trenches 18 may also be refilled using other techniques, such as low pressure (LP) chemical vapor deposition (CVD), Tetraethylorthosilicate (TEOS), or any other oxide deposition technique as is known in the art. The trenches 18 can be filled by a reflow process or the like. Following trench 18 refill, the main surface 16a is preferably planarized using known techniques, such as chemical-mechanical polishing (CMP) or the like.

Figure 10:
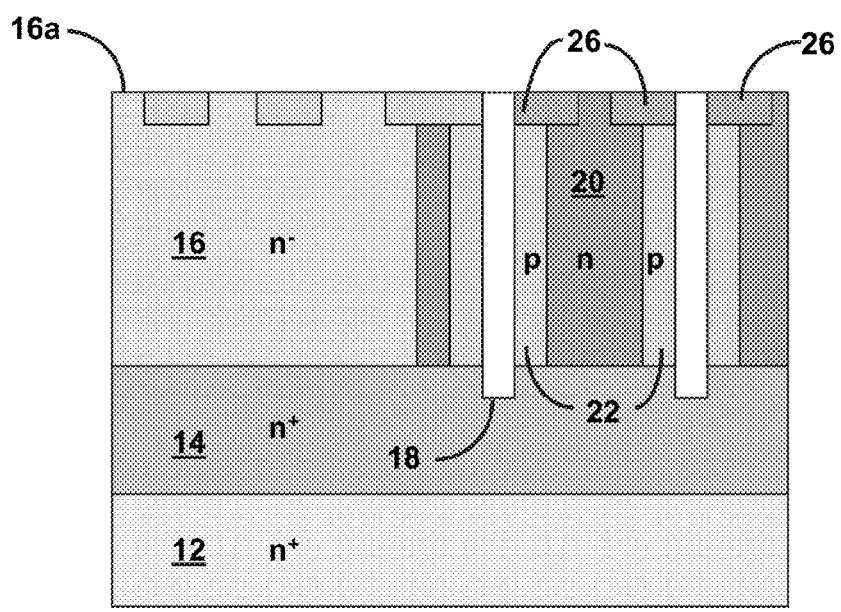
FIG. 10 is a partial sectional elevational view of the structure of FIG. 9 following formation of body regions.

FIG. 10 shows the formation of or body regions 26 proximate the main surface 16a of the second semiconductor layer 16 in the active region. In an exemplary embodiment, body regions 26 are of p-type conductivity, having a dopant concentration suitable for forming inversion layers that operate as conduction channels of the device. In preferred embodiments, the body regions 26 are formed by depositing an oxide layer (not shown) over the main surface 16a, followed by the ion implantation of a p-type dopant (or n-type dopant) into n and p columns 20, 22 through the oxide layer at an energy level of about 30-1000 KeV with a dose range from about $1 \times 10^{10}$ to $1 \times 10^{16}$ atoms cm$^{-2}$, preferably from about $1 \times 10^{14}$ to $1 \times 10^{16}$ atoms cm$^{-2}$, followed by a high temperature drive-in step (i.e., a diffusion). Other methods may be utilized as are known in the art. In addition, the body regions 26 can be formed at least partially by performing ion implantation of the sidewalls of the trenches 18. However, such a step would have to be performed prior to refill of the trenches 18.

Figure 11:
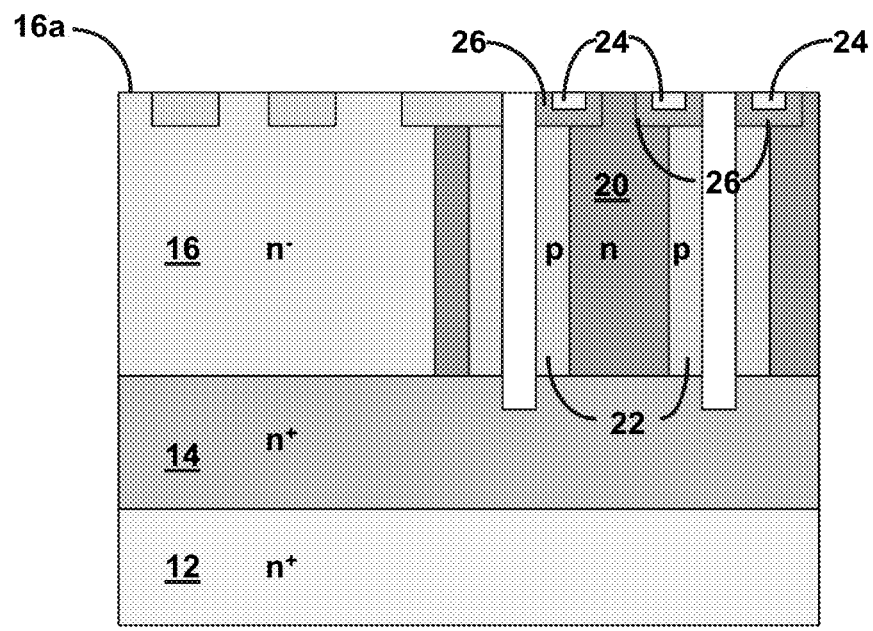
FIG. 11 is a partial sectional elevational view of the structure of FIG. 10 following formation of source/drain regions.

In FIG. 11, source/drain regions 24 are formed in contact with the body regions 26 and proximate the main surface 16a. The source/drain regions 24 are preferably a heavily doped n' type region, which may be formed using techniques similar to those described above for formation of the body regions 26. The orientation of the source/drain region 24 with respect to the body region 26 is not limited, and can be varied depending upon the desired configuration of the device 10. Further, there is no limit to the order in which the two regions 24, 26 may be formed. Moreover, additional regions, such as a body-contact region (not shown), may be formed without departing from the spirit and scope of the invention.

Figure 12:
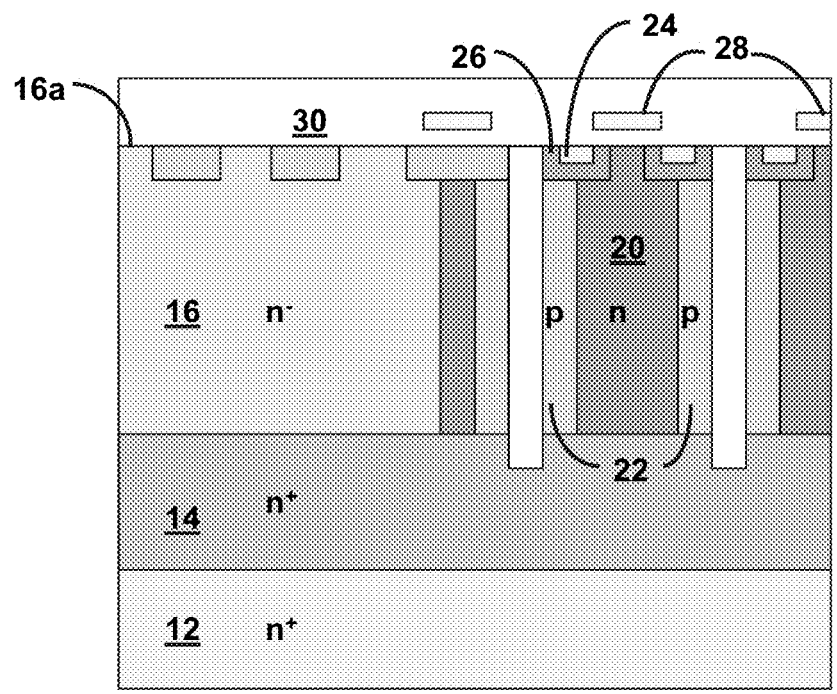
FIG. 12 is a partial sectional elevational view of the structure of FIG. 11 following gate formation and dielectric deposition.

FIG. 12 shows the device 10 following formation of an interlayer dielectric 30 and gates 28. The dielectric layer 30 may be formed using known methods as are described above. The gates 28 may be composed of, for example, a metal, a doped polysilicon, an amorphous silicon, or a combination thereof, and formed by conventional techniques. In the preferred embodiment, a portion of the dielectric layer 30 is formed, followed by the formation of the respective gates 28, then the remainder of the dielectric layer 30 may be deposited to encapsulate the gates 28. The dielectric layer 30 may then be planarized and/or polished. In some embodiments, the first portion of the dielectric layer 30 may be used as the oxide layer described above in formation of the source/drain and body regions 24, 26.

Through-holes are etched in the dielectric layer 30 to provide access to the source/drain regions 24. A metal contact 32 (FIG. 3) is formed according to known techniques, which may extend into the through-holes to connect with the source/drain regions 24. These steps result in the formation of the structure shown in FIG. 3. It is also possible to connect the source/drain regions 24 to the metal contact 32 using separate plugs 42, as shown in FIG. 13.

Figure 13:
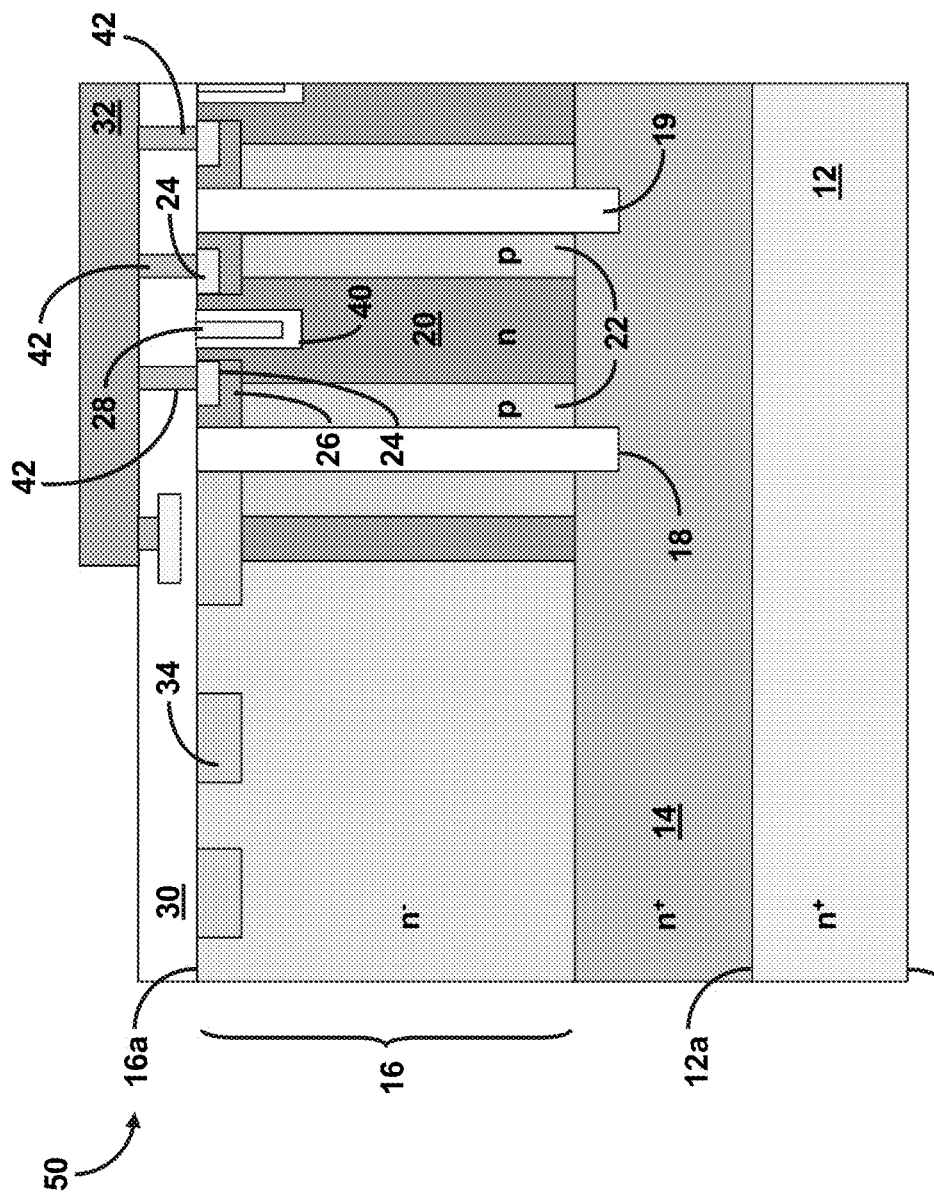
FIG. 13 is a partial sectional elevational view of a superjunction device in accordance with a second embodiment of the present invention.

FIG. 13 shows a second preferred embodiment of the superjunction structure 50. In FIG. 13, the device 50 has a trench-gate structure, i.e., the gates 28 are disposed in gate trenches 40 within the n-column 20. This design allows for a reduced cell size and thus a higher cell density.

The device 10, 50 exhibits an increased blocking voltage as the first semiconductor layer 12 acts as a field spreading region, which can sustain about 200-400 V, depending on the thickness. Thus, the blocking voltage of the device 10, 50 can approach 800 V or more. This is done while keeping the same trench 18 depth, refill volume, and stresses as the conventional device 110 shown in FIG. 1.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A superjunction device comprising:
    a semiconductor substrate having first and second main surfaces and a first doping concentration of a dopant of a first conductivity type;
    a first semiconductor layer formed on the first main surface of the semiconductor substrate and having a second doping concentration of the dopant of the first conductivity type;
    a second semiconductor layer formed on the first semiconductor layer and having a main surface opposite to the first semiconductor layer;
    at least one trench formed in the second semiconductor layer and extending from the main surface through the second semiconductor layer and at least partially into the first semiconductor layer;
    a first region having a third doping concentration of the dopant of the first conductivity type, the first region extending at least partially between the main surface of the second semiconductor layer and the first semiconductor layer;
    a second region having a fourth doping concentration of a dopant of a second conductivity type different from the first conductivity type, the second region being disposed between the first region and a sidewall of the at least one trench and extending at least partially between the main surface of the second semiconductor layer and the first semiconductor layer; and
    a third region having a fifth doping concentration of the dopant of the first conductivity type, the third region being disposed proximate to the main surface of the second semiconductor layer.

2. The superjunction device of claim 1, further comprising a gate separated from the second semiconductor layer by a dielectric layer.

3. The superjunction device of claim 2, further comprising a metal contact connected to the third region.

4. The superjunction device of claim 3, further comprising a fourth region having a sixth doping concentration of the dopant of the second conductivity type, the fourth region being disposed proximate the main surface of the second semiconductor layer and being connected to the third region.

5. The superjunction device of claim 1, wherein the first semiconductor layer has a thickness measured between the first main surface of the semiconductor substrate and the second semiconductor layer of about 150 to about 200 micrometers.

6. The superjunction device of claim 5, wherein the second semiconductor layer has a thickness measured between the main surface thereof and the first semiconductor layer of about 45 micrometers.

7. The superjunction device of claim 1, wherein the first and second semiconductor layers are epitaxial layers.

8. The superjunction device of claim 1, wherein the at least one trench is filled with a dielectric material.

9. The superjunction device of claim 1, wherein the first conductivity type is one of n-type and p-type, and the second conductivity type is the other of n-type and p-type.

10. A method of forming a superjunction device, the method comprising:
    providing a semiconductor substrate having first and second main surfaces and a first doping concentration of a dopant of a first conductivity type;
    forming a first semiconductor layer on the first main surface of the semiconductor substrate, the first semiconductor layer having a second doping concentration of the dopant of the first conductivity type;
    forming a second semiconductor layer on the first semiconductor layer, the second semiconductor layer having a main surface opposite to the first semiconductor layer;
    forming at least one trench extending from the main surface of the second semiconductor layer through the second semiconductor layer and at least partially into the first semiconductor layer;
    doping at least a portion of a sidewall of the at least one trench with the dopant of the first conductivity to form a first region extending at least partially between the main surface of the second semiconductor layer and the first semiconductor layer, the first region having a third doping concentration;

doping at least a portion of the sidewall of the at least one trench with a dopant of a second conductivity type different from the first conductivity type to form a second region between the sidewall of the at least one trench and the first region and extending at least partially between the main surface of the second semiconductor layer and the first semiconductor layer, the second region having a fourth doping concentration; and doping at least one of a portion of the sidewall of the at least one trench and the main surface of the second semiconductor layer with the dopant of the first conductivity to form a third region proximate the main surface, the third region having a fifth doping concentration.

11. The method of claim 10, further comprising forming a gate separated from the second semiconductor layer by a dielectric layer.

12. The method of claim 11, further comprising a forming a metal contact connected to the third region.

13. The method of claim 12, further comprising doping at least one of a portion of the sidewall of the at least one trench and the main surface of the second semiconductor layer with the dopant of the second conductivity type to form a fourth region proximate the main surface, the fourth region having a sixth doping concentration and being connected to the third region.

14. The method of claim 10, wherein the at least one of the first and second semiconductor layers is formed by epitaxial growth.

15. The method of claim 14, wherein the first semiconductor layer is grown to a thickness measured between the first main surface of the semiconductor substrate and the second semiconductor layer of about 150 to about 200 micrometers.

16. The method of claim 15, wherein the second semiconductor layer is grown to a thickness measured between the main surface thereof and the first semiconductor layer of about 45 micrometers.

17. The method of claim 10, wherein the at least one trench is formed by deep reactive ion etching.

18. The method of claim 10, further comprising filling the at least one trench with a dielectric material.

* * * * *